(12) United States Patent
Otsuki

(10) Patent No.: US 9,065,417 B2
(45) Date of Patent: Jun. 23, 2015

(54) OSCILLATION DEVICE AND METHOD FOR MANUFACTURING OSCILLATION DEVICE

(75) Inventor: Tetsuya Otsuki, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 364 days.

(21) Appl. No.: 13/572,203

(22) Filed: Aug. 10, 2012

(65) Prior Publication Data

US 2013/0049542 A1 Feb. 28, 2013

(30) Foreign Application Priority Data

Aug. 23, 2011 (JP) .................... 2011-181802

(51) Int. Cl.
| | |
|---|---|
| H01L 41/053 | (2006.01) |
| H03H 9/05 | (2006.01) |
| H03H 9/10 | (2006.01) |
| H05K 1/02 | (2006.01) |
| H03H 3/04 | (2006.01) |

(52) U.S. Cl.
CPC .............. *H03H 9/0542* (2013.01); *Y10T 29/42* (2015.01); *H03H 9/1014* (2013.01); *H03H 9/1021* (2013.01); *H03H 2003/0478* (2013.01); *H05K 1/0243* (2013.01); *H05K 2201/10075* (2013.01); *H05K 2201/10371* (2013.01)

(58) Field of Classification Search
CPC .............................. H03H 3/04; F02M 61/167
USPC ......................................... 310/340, 346, 348
See application file for complete search history.

(56) References Cited

U.S. PATENT DOCUMENTS

| | | | | |
|---|---|---|---|---|
| 5,841,217 | A * | 11/1998 | Kizaki et al. .................. | 310/348 |
| 6,437,412 | B1 * | 8/2002 | Higuchi et al. ............... | 257/416 |
| 6,543,109 | B1 * | 4/2003 | Taga ............................. | 29/25.35 |
| 7,696,082 | B2 | 4/2010 | Otsuki | |
| 2002/0158699 | A1 * | 10/2002 | Iizuka et al. .................. | 331/158 |
| 2004/0226741 | A1 * | 11/2004 | Masuko et al. ............... | 174/255 |
| 2004/0232802 | A1 * | 11/2004 | Koshido ........................ | 310/348 |
| 2009/0127697 | A1 * | 5/2009 | Pahl .............................. | 257/698 |
| 2010/0066209 | A1 * | 3/2010 | Saitou et al. .................. | 310/340 |
| 2010/0102423 | A1 | 4/2010 | Otsuki | |
| 2011/0210408 | A1 | 9/2011 | Otsuki | |

FOREIGN PATENT DOCUMENTS

| | | |
|---|---|---|
| JP | A-2004-248113 | 9/2004 |
| JP | A-2004-342971 | 12/2004 |
| JP | A-2008-181959 | 8/2008 |
| JP | A-2009-076947 | 4/2009 |
| JP | A-2011-179941 | 9/2011 |

* cited by examiner

*Primary Examiner* — Thomas Dougherty
(74) *Attorney, Agent, or Firm* — Oliff PLC

(57) ABSTRACT

An oscillation device which contributes to the demand for downsizing/miniaturization and commercial production, and provides highly reliable oscillation frequency is provided. The oscillation device includes a base substrate provided with an oscillation member, a lid member that contains the oscillation member in a cavity, an adhesion layer that has a first melting point and connects the base substrate with the lid member, and a metal layer that has a second melting point higher than the first melting point and covers the base substrate, the adhesion layer and the lid member.

10 Claims, 18 Drawing Sheets

OSCILLATION DEVICE AND METHOD FOR MANUFACTURING OSCILLATION DEVICE

The present application claims a priority based on Japanese Patent Application No. 2011-181802 filed on Aug. 23, 2011, the contents of which are incorporated herein by reference.

BACKGROUND

1. Technical Field

The present invention relates to oscillation devices, and methods for manufacturing an oscillation device.

2. Related Art

Sensor modules that can detect physical quantity such as acceleration, angular velocity (i.e., motion sensors) are known. A sensor module may include an oscillation device having a sensor element such as a gyro sensor crystal oscillator (a gyro oscillation member) and a semiconductor circuit element for driving the sensor element contained in a base substrate (see, for example, Japanese Laid-open Patent Application 2004-248113) (Patent Document 1). In the process of manufacturing such an oscillation device, the sensor element and the semiconductor circuit element are mounted within a package, and then the sealing step, in which a reduced pressured state or a vacuum state is created within the package (i.e., a degasification process), is performed, using a metal lid member.

As described in Patent Document 1, the sealing step using a metal lid member is performed through welding a seal ring of the package with the lid member. Accordingly, high-temperature process (for example, at 1000° C. or higher), such as, laser welding, seam welding or the like needs to be performed on the oscillation device. However, when the oscillation device is processed with such high temperatures, the constituting members, such as, the ceramic substrate, the lid member and the like may thermally contract with their respective thermal expansion coefficients, which would likely lower the joint reliability among the constituting members. When the joint reliability between the lid member and the base substrate is lowered, the degree of vacuum (the degree of airtightness) within the package may lower and the crystal impedance (CI) of the sensor element may therefore change, which leads to a possibility that the reliability in oscillation frequency of the oscillation device may lower.

In recent years, further downsizing and miniaturization and commercial production of such oscillation devices are in greater demand. For example, downsizing has very much advanced in recent years to the extent that the device size of an oscillation device is aimed for about 1 mm×1 mm, and remarkable miniaturization of the constituting members has achieved.

If a welding technique, such as seam welding that uses roller electrodes in the sealing step, laser welding that uses a laser beam or the like is used on such oscillation devices which are in pursuit of further downsizing, it is necessary to design the size and layout of the oscillation devices in consideration of applicable conditions of the welding device, in order to practically apply such welding, such as, the roller width of the roller electrodes, the spot diameter of the laser beam and the like. Also, the seam welding that uses roller electrodes is difficult to obtain stable welding quality and also difficult to accommodate itself to welding of members in various shapes other than a rectangular shape. The laser welding requires a very high initial investment in plant and equipment. In view of the above, the use of a welding technique on such oscillation devices which are in pursuit of further downsizing would likely hinder future attempts in further downsizing and miniaturization of oscillation devices and commercial production thereof.

Patent Document 1 describes that metal brazing material such as solder may be used, without performing welding in the sealing step. However, when adhesion material with such a low melting point (for example, 180° C.-300° C.) is actually used, the adhesion material may melt at the time of secondary mounting of the oscillation device to a motherboard or the like, and the degree of vacuum within the cavity may be reduced. For this reason, after manufacturing, the reliability of the oscillation device may be lowered because the thermal resistance of the adhesion material used in the oscillation device is low.

SUMMARY

In accordance with an advantage of some aspects of the invention, there are provided oscillation devices which contribute to the demand for downsizing/miniaturization and commercial production, and provide highly reliable oscillation frequency, and methods for manufacturing such oscillation devices.

A method for manufacturing an oscillation device in accordance with an aspect of an embodiment of the invention includes the steps of preparing a base substrate and a lid member, mounting an oscillation member to the base substrate, joining the base substrate and the lid member through an adhesion layer having a first melting point, thereby containing the oscillation member within a cavity, degassing the cavity, and forming a metal layer that covers the base substrate, the adhesion layer and the lid member with metal having a second melting point higher than the first melting point.

In the embodiment, the melting point is a melting point in the standard atmospheric pressure.

According to the aspect of the invention described above, in the step of joining the base substrate and the lid member thereby containing the oscillation member within the cavity, welding technique is not used, but the adhesion layer is heated to the first melting point, whereby the base substrate and the lid member can be joined together. Therefore, when designing the dimension and layout of the oscillation device, it is not necessary to consider limitations particular to a welding device, such as, the roller width of roller electrodes, the spot diameter of a laser beam and the like. This would contribute to the demand for downsizing and commercial production of oscillation devices. Also, according to the aspect of the embodiment described above, the base substrate, the adhesion layer and the lid member are covered by a metal layer composed of metal having the second melting point higher than the first melting point, such that the oscillation device can maintain the joint between the base substrate and the lid member by the metal layer, even after the manufacturing process, for example, even when the adhesion layer melts by heat applied at the time of secondary mounting. In view of the above, according to the method for manufacturing an oscillation device in accordance with the aspect of the invention, it is possible to provide a method for manufacturing an oscillation device, which contributes to the demand for downsizing/miniaturization and commercial production of oscillation devices, and generates highly reliable oscillation frequency.

In the method for manufacturing an oscillation device in accordance with an aspect of the embodiment, the first melting point may be 350° C. or below.

According to the method for manufacturing an oscillation device described above, in the step of joining the base substrate and the lid member through the adhesion layer, the temperature applied to the device is 350° C. or below, whereby a lower-temperature manufacturing process can be implemented.

In the method for manufacturing an oscillation device in accordance with an aspect of the embodiment, the step of preparing a lid member may include the steps of preparing a first metal substrate having a first surface, forming a conductive layer composed of the same material as that of the adhesion layer on the first surface of the first metal substrate, and etching the first metal substrate and the conductive layer.

According to the method for manufacturing an oscillation device described above, the lid member may be formed from a metal substrate. Accordingly, the lid member having a high degree of flatness at its connecting section with the base substrate can be readily formed, and therefore the reliability in bonding between the base substrate and the lid member can be enhanced.

In the method for manufacturing an oscillation device in accordance with an aspect of the embodiment, the step of preparing the lid member may include forming a plurality of the lid members from the first metal substrate.

According to the method for manufacturing an oscillation device described above, it is possible to provide a method for manufacturing an oscillation device that can better contribute to the demand for commercial production.

In the method for manufacturing an oscillation device in accordance with an aspect of the embodiment, the step of preparing a base substrate may include the steps of preparing a second metal substrate having a first surface and a second surface on the opposite side of the first surface, forming a plurality of metal protrusions by etching the second metal substrate from the side of the first surface, forming a dielectric layer on the side of the first surface to cover the plurality of metal protrusions, forming a plurality of metal members made up of the metal protrusions by etching the second metal substrate from the side of the second surface to make the plurality of metal protrusions become independent from one another, grinding the dielectric layer such that the plurality of metal members are exposed through the dielectric layer, and forming a wiring patter that connects to the metal members.

According to the method for manufacturing an oscillation device described above, it is possible to provide a method for manufacturing an oscillation device that can better contribute to the demand for commercial production.

In the method for manufacturing an oscillation device in accordance with an aspect of the embodiment, the step of mounting the oscillation member may include mounting a plurality of the oscillation members on a substrate including a plurality of the base substrates, respectively, and the step of containing the oscillation member within the cavity may include the steps of containing the plurality of the oscillation members with a plurality of the lid members, and cutting the substrate after the step of forming the metal layer.

According to the method for manufacturing an oscillation device described above, it is possible to provide a method for manufacturing an oscillation device that can better contribute to the demand for commercial production.

An oscillation device in accordance with an aspect of another embodiment of the invention includes: a base substrate provided with an oscillation member, a lid member that contains the oscillation member in a cavity, an adhesion layer that has a first melting point and joins the base substrate with the lid member, and a metal layer that has a second melting point higher than the first melting point and covers the base substrate, the adhesion layer and the lid member.

The oscillation device described above includes the adhesion layer that has the first melting point and joins the base substrate with the lid member, and the metal layer that has the second melting point higher than the first melting point and covers the base substrate, the adhesion layer and the lid member. Accordingly, the base substrate, the adhesion layer and the lid member are covered by the metal layer having the second melting point higher than the first melting point. Therefore, bonding between the base substrate and the lid member can be reliably maintained by the metal layer even when the oscillation device is in a temperature environment higher than the second melting point. Accordingly, even when heat treatment is conducted for secondary packaging of the oscillation device at temperatures at which the adhesion layer melts, the degree of vacuum within the cavity that has been vacuum-treated with the metal layer can be maintained, such that the reliability in oscillation frequency of the oscillation device can be securely maintained. Also, according to the structure described above, the base substrate and the lid member are bonded together by the adhesion layer. Therefore, the manufacturing process does not need to use welding technology, which can contribute to the demand for miniaturization and commercial production of oscillation devices.

In view of the above, according to the oscillation device described above, oscillation devices which contribute to the demand for downsizing/miniaturization and commercial production, and have highly reliable oscillation frequency can be provided.

In the oscillation device in accordance with an aspect of the embodiment, the first melting point may be 350° C. or below.

According to the oscillation device described above, because the temperature necessary for bonding the base substrate and the lid member through the adhesion layer is 350° C. or below, it is possible to provide oscillation devices with which a lower-temperature manufacturing process can be implemented.

In the oscillation device in accordance with an aspect of the embodiment, the base substrate may include a plurality of metal members, and a dielectric layer that retains the plurality of metal members.

According to the oscillation device described above, oscillation devices which better contribute to the demand for commercial production.

In the oscillation device in accordance with an aspect of the embodiment, the metal member and the lid member may be composed of the same metal material.

According to the oscillation device described above, the metal member and the lid member have the same thermal expansion coefficient, such that oscillation devices having improved reliability in bonding between the base substrate and the lid member can be provided.

DESCRIPTION OF EXEMPLARY EMBODIMENTS

Exemplary embodiments of the invention will be described below with reference to the accompanying drawings. It is noted, however, that the invention is not limited only to the embodiments described below. The invention also includes combinations freely combining the following embodiments and their modification examples.

1. Oscillation Device

An oscillation device in accordance with an embodiment will be described below with reference to the accompanying drawings.

Figure 1A:
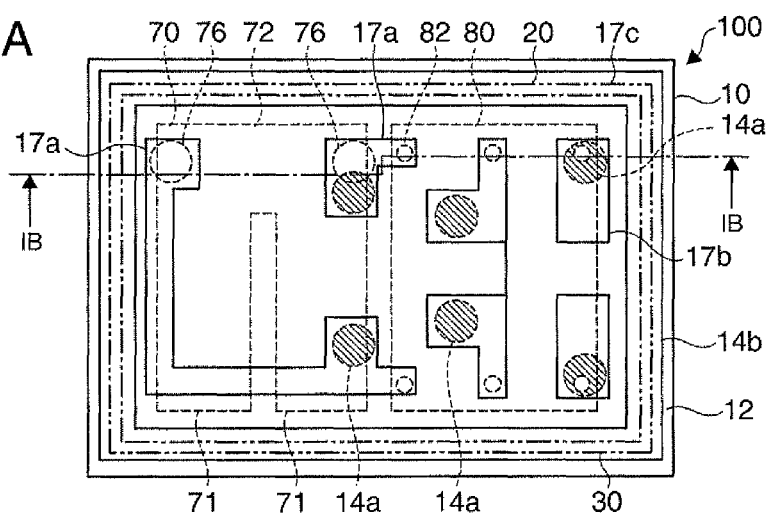
FIGS. 1A-1C are plan views and a cross-sectional view schematically showing main portions of an oscillation device in accordance with an embodiment of the invention.
Figure 1B:
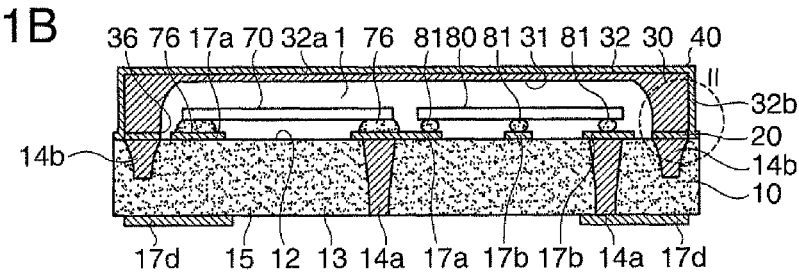
Figure 1C:
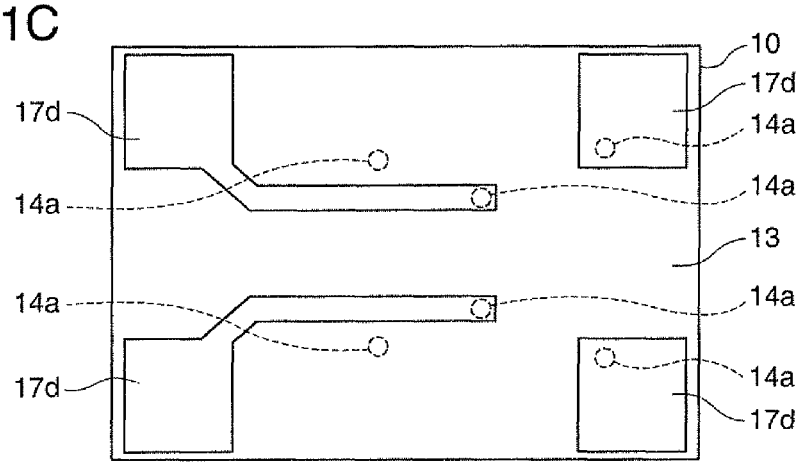
Figure 2:
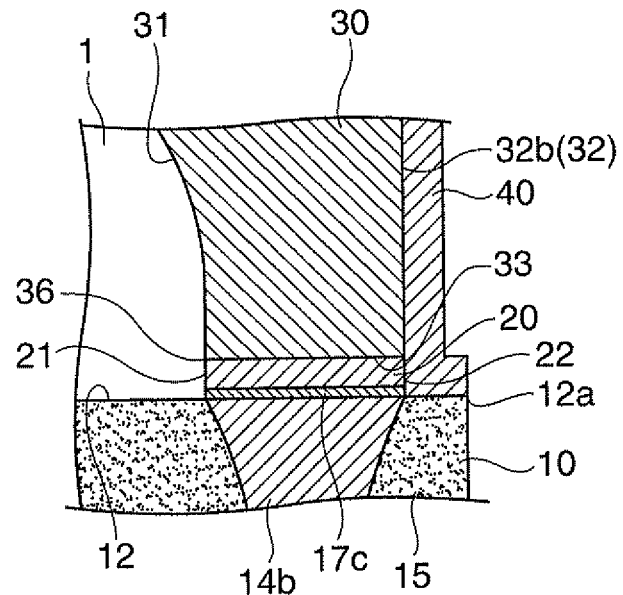
FIG. 2 is an enlarged cross-sectional view of a portion II indicated by a broken line in FIG. 1B.

FIGS. 1A-1C schematically show the structure of an oscillation device 100 in accordance with an embodiment of the invention. FIG. 1A is a plan view schematically showing a surface of the oscillation device 100 where an oscillation member 70 is mounted, with a lid member 30 being omitted for convenience sake. FIG. 1B is a cross-sectional view taken along a line IB-IB of FIG. 1A, and FIG. 1C is a plan view schematically showing a bottom surface of the oscillation device 100 opposite to the surface where the oscillation member 70 is mounted. FIG. 2 is an enlarged view of a portion indicated by a broken line II of FIG. 1B.

As shown in FIGS. 1A-1C, the oscillation device 100 in accordance with the present embodiment includes a base substrate 10 with an oscillation member 70 mounted thereon, a lid member 30 that contains the oscillation member 70 within a cavity 1, an adhesion layer 20 that has a first melting point and joins the base substrate 10 with the lid member 30, and a metal layer 40 that has a second melting point higher than the first melting point, and covers the base substrate 10, the adhesion layer 20 and the lid member 30.

As shown in FIG. 1A and FIG. 1B, the base substrate 10 is a member in which the oscillation member 70 to be described below is mounted (electrically connected), and is also a member that joins with the lid member 30 to be described below and is capable of containing the oscillation member 70 within the cavity 1.

The cavity 1 is a space defined by the base substrate 10 and the lid member 30 to be described below. The cavity 1 is degasified (i.e., vacuum-treated or treated with inert gas), and may have a reduced pressure state, and more preferably a vacuum state. Also, the cavity 1 may be an inert gas atmosphere such as a nitrogen gas atmosphere. Therefore, although not shown, a through-hole may be provided in the base substrate 10 or the lid member 30 which, after joining the base substrate 10 and the lid member 30 together, enables degassing of the cavity 1 and can be closed after the degasification treatment.

The base substrate 10 may have any shape and composition, without any particular limitation, as long as it can be joined with the lid member 30 and can contain the oscillation member 70. The base substrate 10 may be in a container-like shape having an opening section through which the oscillation member 70 can be introduced (see FIG. 4) therein. Details of the base substrate 10 will be described below.

The base substrate 10 may be a plate-like member having a first surface 12 (a mounting surface where the oscillation member 70 is mounted), and a second surface 13 on the opposite side of the first surface 12 (a bottom surface where external terminals are formed), as shown in FIG. 1B. The first surface 12 and the second surface 13 may be rectangular flat surfaces. Although not shown, the first surface 12 and the second surface 13 may have recesses formed therein, instead of being rectangular flat surfaces.

The base substrate 10 may be a plate-like member formed from, for example, metal, resin, single crystal silicon, glass, ceramics, or the like. More preferably, for example, as shown in FIG. 1B, the base substrate 10 may be formed from plural metal members 14 (14a, 14b) and a dielectric layer 15 that retains the plural metal members 14.

The metal members 14a are columnar members (post-like members), that penetrate through the base substrate 10, are exposed at the first surface 12 and the second surface 13, and form portions of the first surface 12 and the second surface 13, as shown in FIG. 1A-FIG. 1C.

The exposed portions of the metal members 14a in the first surface 12 may be a part of die pads for mounting the oscillation member 70 and an IC chip 80 to be described below. The exposed portions of the metal members 14a in the second surface 13 may be a part of external terminals for connecting the oscillation device 100 to an external substrate such as a mother board or the like. At least one of the metal members 14a may be a through-electrode for grounding. Also, at least one of the metal members 14a may be a through-electrode for supplying electrical power.

The metal members 14b are circular members that surround the plural metal members 14a, do not penetrate through the base substrate 10, are exposed in the first surface 12, and form a part of the first surface 12, as shown in FIGS. 1A-1C. The exposed portions of the metal members 14b in the first surface 12 may be connecting portions that are connected with the lid member 30 of the base substrate 10. Therefore, the exposed portions of the metal members 14b in the first surface 12 may have a shape corresponding to the connecting section of the lid member 30.

The cross-sectional shape of each of the metal members 14a and 14b in the thickness direction of the base substrate 10 may be formed such that the cross sectional area (width) thereof becomes gradually smaller in a direction from the first surface 12 to the second surface 13. Although not shown, each of the metal members 14 (14a and 14b) may be formed such that the metal member 14 has the same cross sectional area (width) along a direction from the first surface 12 to the second surface 13.

The metal members 14 (14a, 14b) may be made of any material, without any particular limitation, as long as they are made of metal. The metal members 14 may be formed from, for example, iron (Fe), copper (Cu), gold (Au), nickel (Ni), manganese (Mn), titanium (Ti), tungsten (W), aluminum (Al), aluminum oxide (alumina), 42 alloy (Fe—Ni alloy), kovar (Fe—Ni—Co alloy), or the like.

The dielectric layer 15 that retains the plural metal members 14 fills spaces between the plural metal members 14 (14a, 14b) and compose the first surface 12 and the second surface 13, as shown in FIG. 1B. The dielectric layer 15 may be made of any material, without any particular limitation, as long as it has dielectric property. The dielectric layer 15 may be formed from known resin material, such as, thermosetting epoxy resin or the like.

As shown in FIG. 1A-FIG. 1C, wiring patterns 17 (17a, 17b, 17c, 17d) are formed on the first surface 12 and the second surface 13 of the base substrate 10. First wiring patterns 17a, 17b and 17c may be formed on the first surface 12 of the base substrate 10, and second wiring patterns 17d may be formed on the second surface 13.

The wiring patterns 17 may be reallocation wirings to be connected to the metal members 14a. A part of the first wiring patterns 17a, 17b and 17c may be electrode pads for mounting the oscillation member 70 and the IC chip 80 to be described below. A part of the second wiring patterns 17d may be external connection terminals for connecting to an external substrate such as a motherboard, or the like.

As shown in FIG. 1A, the first wiring patterns 17a, 17b and 17c may include the wiring patterns 17a that are connected to the metal members 14a and are to be provided with the oscillation member 70 and the IC chip 80 mounted thereon, the wiring patterns 17b that are connected to the metal members 14a and are to be provided with only the IC chip 80 mounted thereon, and the wiring patterns 17c that are connected to the metal members 14b and are to be disposed at the connecting sections with the lid member 30. As shown in FIG. 1B, the second wiring patterns 17d may connect the metal members 14a and form external connection terminals at the four corners of the second surface 13.

The wiring patterns 17 are not limited to any particular material or composition. The wiring patterns 17 may have a single layer structure, or may be formed from a laminated structure of a plurality of conductive films, although not shown.

The wiring patterns 17 may be formed from a laminated structure including, for example, layers of any of platinum (Pt), iridium (Ir), gold (Au), nickel (Ni), copper (Cu), titanium (Ti), tungsten (W), chrome (Cr), zinc (Sn) and the like. Preferably, the wiring pattern 17 may have a laminate structure including a titanium/tungsten layer (a first layer), a copper layer (a second layer), a nickel layer (a third layer) and a gold layer (a fourth layer).

As shown in FIG. 1B, the lid member 30 and the base substrate 10 are connected together on the side of the first surface 12 of the base substrate 10, whereby the oscillation member 70 is contained within the cavity 1. As shown in FIG. 2, the lid member 30 is joined to the base substrate 10 through the adhesion layer 20.

As shown in FIG. 1B and FIG. 2, the adhesion layer 20 can join the base substrate 10 and the lid member 30 together, and seal the cavity 1. As shown in FIG. 2, for example, the adhesion layer 20 may be provided in a manner to join the first wiring pattern 17c of the base substrate 10 with the lid member 30. The adhesion layer 20 fills a gap between the base substrate 10 and the lid member 30, thereby securely sealing the cavity 1 that has been degassed.

The adhesion layer 20 has a first melting point that is 350° C. or lower, and may be made of any material, without any particular limitation, as long as it exhibits adhesion at temperatures at the first melting point or higher. As the material of the adhesion layer 20, metal brazing material, such as, for example, Sn, solder, Au solder, and the like may be used.

The lid member 30 may have any shape and structure, without any particular limitation, as long as it can join with the base substrate 10, and can form the cavity 1 for enclosing the oscillation member 70 and the like. For example, as shown in FIG. 1B and FIG. 2, the lid member 30 may be in the shape of a container having the opening section 36.

Also, the lid member 30 may have a plate-like shape, when the base substrate 10 has a container-like shape (see FIG. 4). Details of the lid member 30 will be described below.

The lid member 30 may have an inner surface 31 and an outer surface 32, as shown in FIG. 1B. The inner surface 31 defines a surface that forms a wall surface of the cavity 1 of the lid member 30, and the outer surface 32 defines a surface on the side of the air atmosphere and on the opposite side of the inner surface 31.

The inner surface 31 does not have corners, and may be formed from a flat surface and/or a curved surface. As shown in FIG. 1B, the outer surface 32 may include an upper surface 32a that extends generally in parallel with the first surface 12 of the base substrate 10, and a side surface 32b that is continuous with the upper surface 32a.

Here, as shown in FIG. 2, a surface that is continuous with the inner surface 31 and the side surface 32b is defined as a connection surface 33. The connection surface 33 is a surface at which the lid member 30 connects to the base substrate 10, and is a flat surface.

The lid member 30 may be made of any material, without any particular limitation. As the material of the lid member 30, for example, metal, resin, single crystal silicon, glass, ceramics or the like may be used.

In view of processability, such as, processing accuracy and processing readiness, the material of the lid member 30 may preferably be selected from metals, such as, for example, iron (Fe), copper (Cu), gold (Au), nickel (Ni), manganese (Mn), titanium (Ti), tungsten (W), aluminum (Al), aluminum oxide (alumina), 42 alloy (Fe—Ni alloy), and kovar (Fe—Ni—Co alloy).

More preferably, the lid member 30 may be made of the same metal material as that of the metal members 14 used in the base substrate 10. Accordingly, internal stress to be generated along with changes in the temperature can be alleviated, and thus the reliability of the oscillation device 100 can further be improved.

As shown in FIG. 1B and FIG. 2, the oscillation device 100 in accordance with the present embodiment is equipped with the metal layer 40 that has the second melting point higher than the first melting point, and covers the base substrate 10, the adhesion layer 20 and the lid member 30.

The metal layer 40 is formed so as to cover, at least, an outer surface 22 of the adhesion layer 20, the first surface 12 of the base substrate 10 which is continuous with the outer surface 22, and a part of the outer surface 32 of the lid member 30 which is continuous with the outer surface 22. In other words, the metal layer 40 is formed in a manner to join the base substrate 10 and the lid member 30 together. Also, the metal layer 40 may be formed, using electroplating or electroless plating.

The outer surface 22 of the adhesion layer 20 is a surface that is exposed to the air atmosphere before formation of the metal layer 40, and is located on the opposite side of an inner surface 21 of the adhesion layer 20 which is a surface exposed to the cavity 1.

As shown in FIG. 1B, the metal layer 40 may be formed in a manner to cover entirely the lid member 30. According to this structure, the lid member 30 can be protected from moisture in the atmosphere, due to surface-covering and anticorrosion effects of the metal layer 40, and therefore the reliability of the oscillation device 100 can be improved.

Also, as shown in FIG. 2, the metal layer 40 may be formed in a manner to cover an outer peripheral section 12a of the first surface 12 of the base substrate 10. By this structure, the metal layer 40 can join with the base substrate 10 in a greater area, such that the base substrate 10 and the lid member 30 can be more reliably joined together.

The metal layer 40 may be made of any material or in any structure, without any particular limitation, as long as it is made of metal having the second melting point higher than the first melting point (350° C.). Preferably, the second melting point may be, for example, 900° C. The metal layer 40 may have a single layer structure. Alternatively, although not shown, the metal layer 40 may have a laminated structure composed of multiple metal layers.

As the material of the metal layer 40, for example, iron (Fe), copper (Cu), silver (Ag), gold (Au), iridium (Ir), nickel (Ni), cobalt (Co), chrome (Cr), manganese (Mn), titanium (Ti), tungsten (W), 42 alloy (Fe—Ni alloy), and kovar (Fe—Ni—Co alloy) may be used.

More preferably, the metal layer 40 may be made of the same metal material as that of the metal used for the lid member 30. Accordingly, internal stress to be generated along with changes in the temperature can be alleviated, and thus the reliability of the oscillation device 100 can further be improved.

The oscillation member 70 contained in the cavity 1 may be an oscillation member in any mode. As the mode of the oscillation member 70, an AT oscillation member, a tuning fork type oscillation member, a SAW oscillation member, or a walk type oscillation member may be used. The oscillation member 70 per se may be made of piezoelectric material, such as, crystal, lithium tantalate, lithium niobate or the like, or may be made of material without having piezoelectric property. When the oscillation member 70 is formed with material without having piezoelectric property, for example, a piezoelectric element may further be included in the composition of the oscillation member 70.

The present embodiment is described using an example in which the oscillation member 70 is a tuning fork type oscillation member formed from crystal. The oscillation member 70 may be supported on a wall surface (the first surface 12 in the illustrated example) within the cavity 1 by supporting members 76 having conductivity, such as, conductive adhesive, conductive paste, brazing material or the like. As shown in FIG. 1A, the oscillation member 70 has two vibration arms 71, and is supported by a base section 72 in a cantilever fashion. The vibration arms 71 extending from the base section 72 can flexurally vibrate within the cavity 1. Although not shown, a plurality of electrodes for flexurally vibrating at least the vibration arms 71 are provided at the vibration arms 71 and the base section 72.

As shown in FIG. 1A and FIG. 1B, an IC chip 80 mounted on the base substrate 10 may be contained within the cavity 1. The IC chip 80 may be mounted on the first surface 12 of the base substrate 10 with, for example, brazing material 81, as shown in FIG. 1B, and electrically connected with the wiring patterns 17. The IC chip 80 is an oscillation circuit component that may include a drive circuit for driving and vibrating the oscillation member 70 and a detection circuit for detecting vibration generated on the oscillation member 70 when angular velocity is applied thereto.

The oscillation device 100 in accordance with the present embodiment can be constituted with any one of the structures described above.

The oscillation device 100 in accordance with the present embodiment has, for example, the following characteristics.

The oscillation device 100 in accordance with the present embodiment includes the adhesion layer 20 that has the first melting point and joins the base substrate 10 and the lid member 30 together, and the metal layer 40 that has the second melting point higher than the first melting point and covers the base substrate 10, the adhesion layer 20 and the lid member 30.

According to the structure described above, the base substrate 10, the adhesion layer 20 and the lid member 30 are covered by the metal layer 40 made of metal having the second melting point higher than the first melting point of the adhesion layer 20. Therefore, the connection between the base substrate 10 and the lid member 30 can be more securely maintained by the metal layer 40 even in a temperature environment in which the oscillation device 100 is heated close to the first melting point or at temperatures higher than the first melting point. For example, even when heat treatment is conducted for secondary mounting of the oscillation device 100 at temperatures at which the adhesion layer 20 melts, the degree of vacuum within the cavity 1 is maintained by the metal layer 40, such that the reliability in oscillation frequency of the oscillation device 100 can be secured.

Also, according to the aspect described above, the base substrate 10 and the lid member 30 are bonded by the adhesion layer 20 without using welding. Therefore, it is not necessary to use welding technology in the manufacturing process, which contributes to the demand for downsizing and commercial production of oscillation devices.

In view of the above, according to the oscillation device 100 described above, it is possible to provide oscillation devices that contribute to the demand for downsizing/miniaturization and commercial production, and can provide highly reliable oscillation frequency.

First Modification Example

A modification example of the oscillation device 100 in accordance with the present embodiment will be described with reference to the accompanying drawings.

Figure 3A:
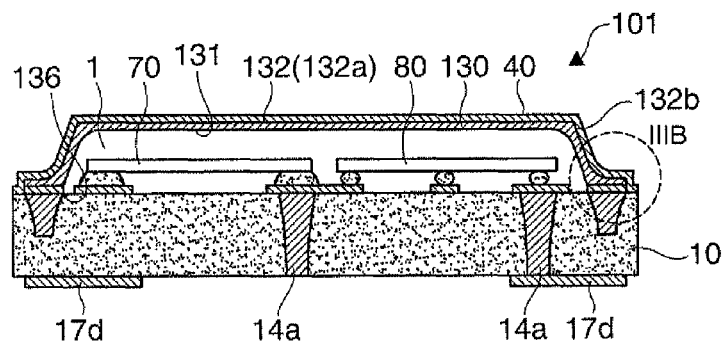
FIG. 3A is a cross-sectional view schematically showing main portions of an oscillation device in accordance with a first modification example of the embodiment.
Figure 3B:
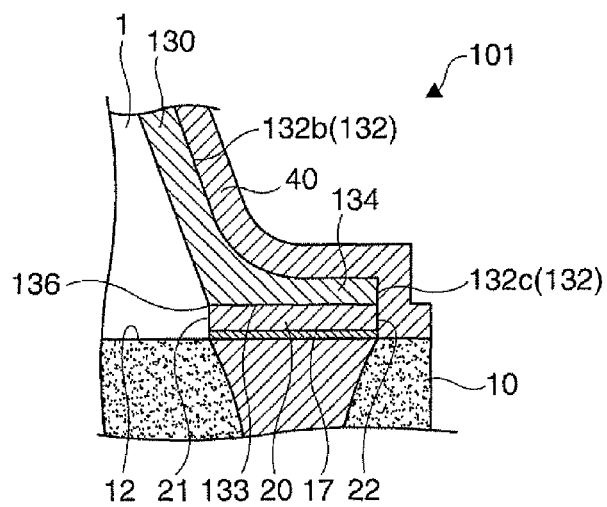
FIG. 3B is an enlarged view of a portion 111B indicated by a broken line in FIG. 3A.

FIGS. 3A-3B schematically show the structure of an oscillation device 101 in accordance with a first modification example. FIG. 3A is a cross-sectional view of the oscillation device 101, and the cross section corresponds to the line IB-IB of FIG. 1A, and FIG. 3B is an enlarged view of a portion indicated by a broken line IIIB of FIG. 3A.

The oscillation device 101 is different from the oscillation device 100 only in the composition of the lid member 30. In the following description of the oscillation device 101, components that are substantially the same as those of the oscillation device 100 will be appended with the same reference numbers and their detailed description will be omitted.

As shown in FIG. 3A and FIG. 3B, a lid member 130 is in a container-like shape having an opening section 136, and includes an inner surface 131 and an outer surface 132. The inner surface 131 defines a surface that forms a wall surface of the cavity 1 of the lid member 130, and the outer surface 132 defines a surface on the side of the air atmosphere and on the opposite side of the inner surface 131.

The inner surface 131 does not have corner sections, and may be formed from a flat surface and/or a curved surface. As shown in FIG. 3A and FIG. 3B, the outer surface 132 may include an upper surface 132a that extends generally in parallel with the first surface 12 of the base substrate 10, a first side surface 132b continuous with the upper surface 132a, and a second side surface 132c that is continuous with the first side surface 132a.

Here, as shown in FIG. 3B, a surface that is continuous with the inner surface 131 and the second side surface 132c is defined as a connection surface 133. The connection surface 133 is a surface at which the lid member 130 joins to the base substrate 10, and is a flat surface. As shown in FIG. 3A and FIG. 3B, the first side surface 132b is a taper surface and includes a curved surface that protrudes toward the side of the base substrate 10. Also, as shown in FIG. 3B, the second side surface 132c is a flat surface that is generally perpendicular to the first surface 12.

As shown in FIG. 3A and FIG. 3B, the lid member 130 includes an outwardly extending section 134 made up of a portion of the first side surface 132b, the second side surface 132c and a portion of the connection surface 133. The outwardly extending section 134 is a section outwardly extending (to the side opposite to the cavity 1) at the opening section 136 of the lid member 130.

According to the oscillation device 101 of the modification example, for example, the following characteristics can be further provided, in addition to the characteristics similar to those of the oscillation device 100.

In the oscillation device 101, the lid member 130 is equipped with the outwardly extending section 134 at its connection section with the base substrate 10. Accordingly, the connection section can provide a greater connection area, such that the reliability in connection between the base substrate 10 and the lid member 130 provided by the adhesion layer 20 can be improved.

Also, as the connection section has a greater area, a greater distance can be secured between the inner surface 21 and the outer surface 22 of the adhesion layer 20. Accordingly, even when the adhesion layer 20 melts, it is difficult to form a flow path penetrating from the inner surface 21 to the outer surface 22, which can thus provide a structure that would make it difficult to reduce the degree of vacuum. Therefore, the reliability in oscillation devices can be improved.

Second Modification Example

Figure 4A:
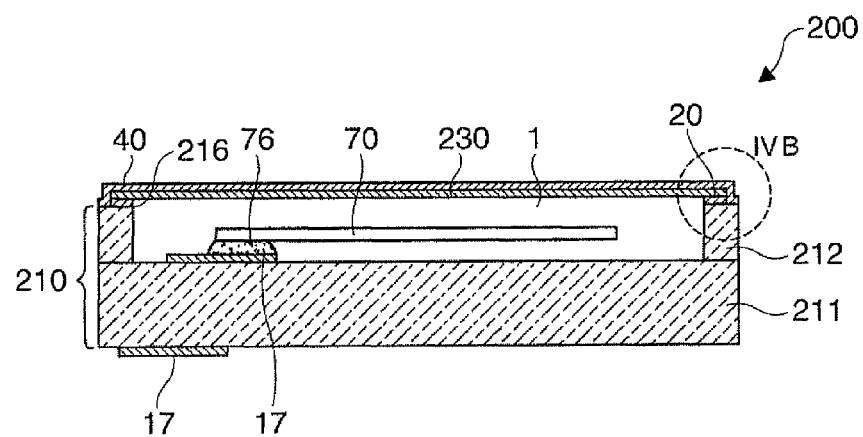
FIG. 4A is a cross-sectional view schematically showing main portions of an oscillation device in accordance with a second modification example of the embodiment.
Figure 4B:
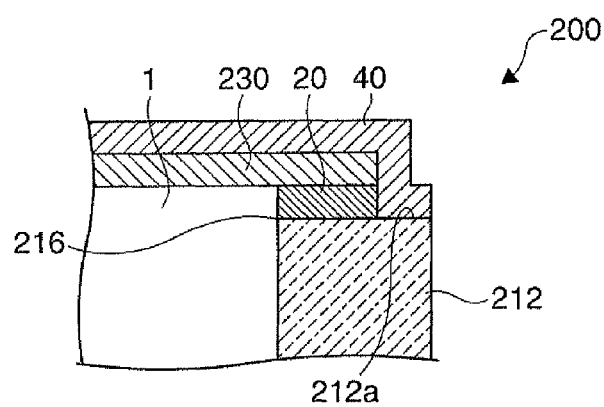
FIG. 4B is an enlarged view of a portion IVB indicated by a broken line in FIG. 4A.

FIGS. 4A-4B schematically show the structure of an oscillation device 200 in accordance with a second modification example. FIG. 4A is a cross-sectional view of the oscillation device 200, and FIG. 4B is an enlarged view of a portion indicated by a broken line IVB of FIG. 4A.

The oscillation device 200 is different from the oscillation device 100 in the structure of the base substrate 10 and the lid member 30. In the following description of the oscillation device 200, components that are substantially the same as those of the oscillation device 100 will be appended with the same reference numbers and their detailed description will be omitted.

As shown in FIG. 4A and FIG. 4B, a base substrate 210 is in a container-like shape having an opening section 216, and a lid member 230 is a plate-like member.

As shown in FIG. 4A, the base substrate 210 has a shape wherein the oscillation member 70 can be contained therein through the opening section 216. The base substrate 210 may be formed from a single member or, as shown in FIG. 4A, may be formed from a base substrate 211 on which the oscillation member 70 and the like are mounted, and a wall section 212 that contains the oscillation member 70.

As shown in FIG. 4A, the lid member 230 is a plate-like member, and seals the opening section 216 of the base substrate 210. Here, as shown in FIG. 4B, the base substrate 210 and the lid member 230 are connected together by an adhesion layer 20, and a metal layer 40 is formed in a manner to cover the base substrate 210, the adhesion layer 20 and the lid member 230. More specifically, the lid member 230 is connected through the adhesion layer 20 to an upper surface 212a that defines the opening section 216 of the wall section 212 of the base substrate 210.

As shown in FIG. 4B, the metal layer 40 can cover the base substrate 210 (the surface 212a), the adhesion layer 20 and the lid member 230.

According to the oscillation device 200 of the modification example, characteristics similar to those of the oscillation device 100 can be obtained.

2. Method for Manufacturing Oscillation Device

A method for manufacturing an oscillation device in accordance with an embodiment of the invention will be described below with reference to the accompanying drawings. FIGS. 5-17 are schematic figures for describing a method for manufacturing an oscillation device in accordance with an embodiment of the invention.

Figure 5:
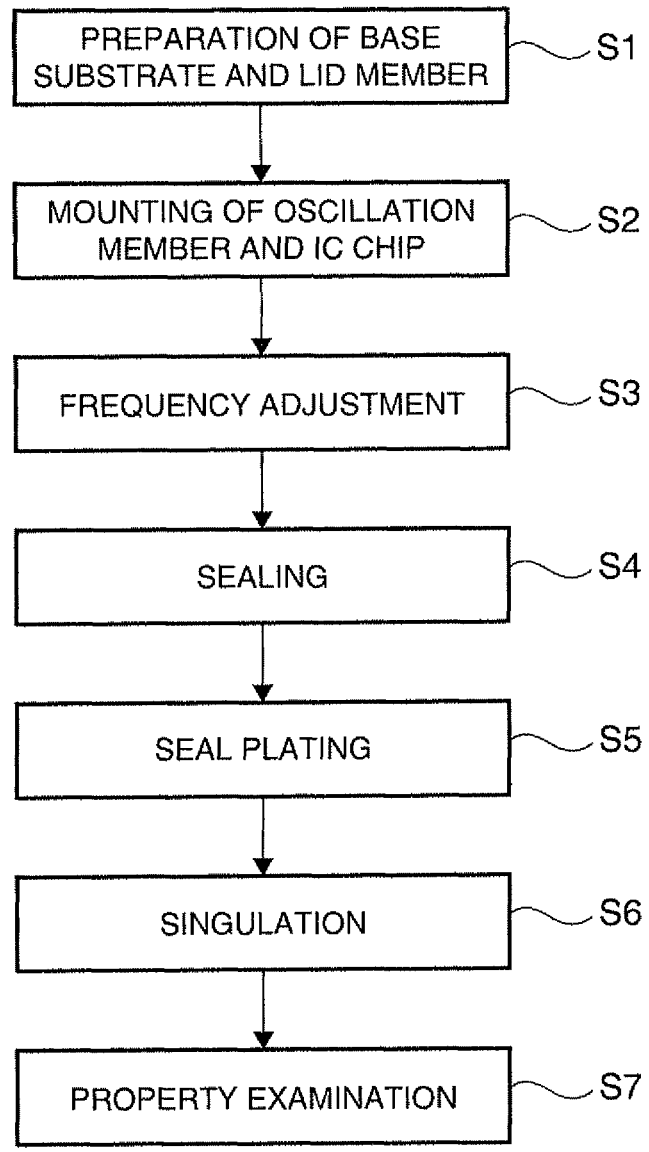
FIG. 5 is a flow chart for describing a method for manufacturing an oscillation device in accordance with an embodiment of the invention.

As shown in FIG. 5, the process for manufacturing an oscillation device includes the steps of preparing a base substrate 10 and a lid member 30 (S1), mounting an oscillation member 70 on the base substrate 10 (S2), joining the base substrate 10 with the lid member 30 through an adhesion layer 20 having a first melting point, thereby containing the oscillation member 70 within a cavity 1 (S4), degassing the cavity 1 (S4), and forming a metal layer by plating to cover the base substrate 10, the adhesion layer 20 and the lid member 30 with a metal having a second melting point higher than the first melting point (S5).

In the following description of the method for manufacturing an oscillation device in accordance with the embodiment, the steps of preparing the lid member 30 (130) (S11-S14) will be described first with reference to FIGS. 6-10. Next, referring to FIGS. 11-14, the steps of preparing the base substrate 10 (S21-S28) will be described. Thereafter, the method for manufacturing an oscillation device in accordance with the present embodiment (S1-S7) in its entirety will be described.

2.1 Preparation of Lid Member (S11-S14)

Figure 6:
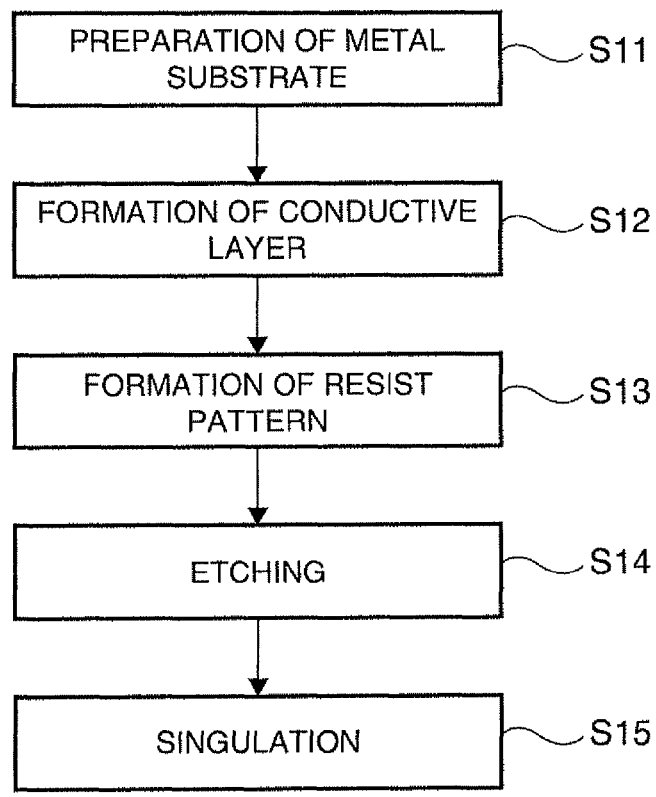
FIG. 6 is a flow chart for describing the steps of preparing a lid member in the method for manufacturing an oscillation device in accordance with an embodiment of the invention.

As shown in FIG. 6, the step of preparing the lid member 30 includes the step of preparing a metal substrate (S11), the step of forming a conductive layer composed of the same material as that of an adhesion layer (S12), and the step of etching the metal substrate and the conductive layer (S13, S14). Also, the step of preparing the lid member 30 may include separating a patterned metal substrate 30' into individual segments, thereby concurrently forming a plurality of lid members 30 (S15).

Preparation of Metal Substrate (S11)

Figure 7A:
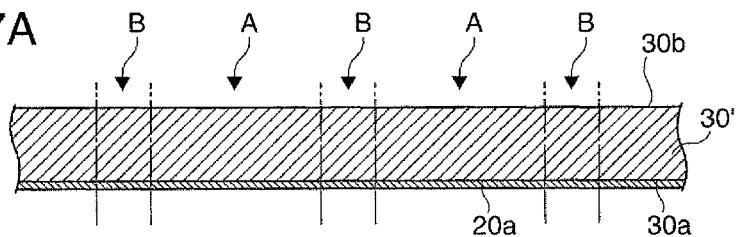
FIGS. 7A-7E are schematic cross-sectional views for describing a method for manufacturing an oscillation device in accordance with an embodiment of the invention.

First, a metal substrate 30' is prepared. The metal substrate 30' is a member that becomes a lid member 30, and is a substrate having a first surface 30a, and a second surface 30b on the opposite side of the first surface 30a, as shown in FIG. 7A. Accordingly, the material of the metal substrate 30' is selected from materials that can be used for the lid member 30.

The metal substrate 30' may be provided with a plurality of first regions A and second regions B surrounding the first regions A, respectively. The first region A is a region that becomes to be the lid member 30, and the second regions B may be regions to be cut (dicing line) in the singulation step.

Formation of Conductive Layer (S12)

Next, as shown in FIG. 7A, a conductive layer 20a is formed on the entire surface of the first surface 30a by, for example, electroplating. The conductive layer 20a is a conductive layer that becomes to be an adhesion layer 20. Therefore, the conductive layer 20a is formed from metal material having a first melting point.

Formation of Resist Pattern (S13)

Figure 7B:
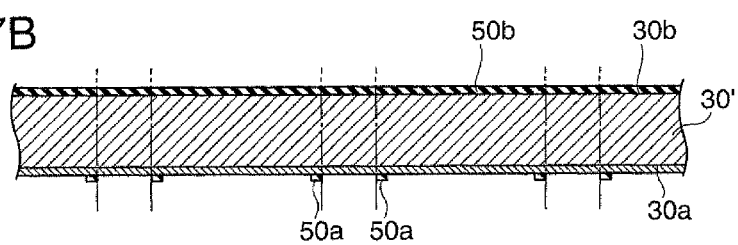

Next, as shown in FIG. 7B, a resist pattern 50a having a desired pattern is formed on the conductive layer 20a by known photolithography technology. Also, a resist pattern 50b may also be formed to cover the entire surface of the second surface 30b.

Etching of Metal Substrate and Conductive Layer (S14)

Figure 7C:
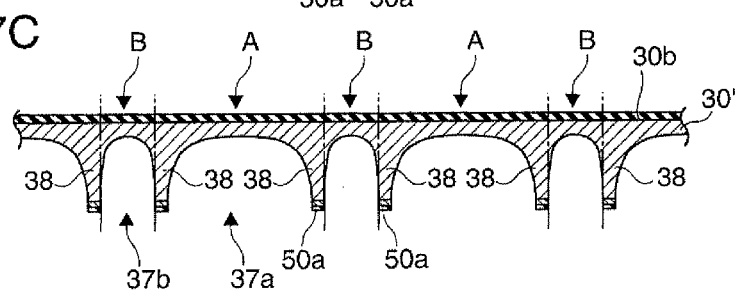
Figure 7D:
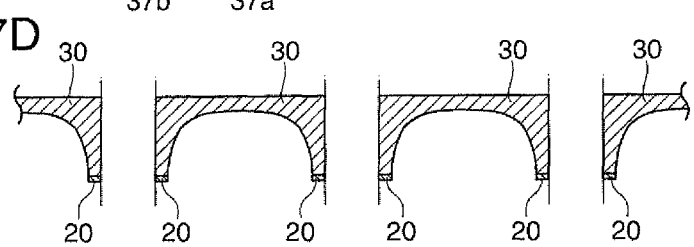

Next, as shown in FIG. 7C, the conductive layer 20a and the metal substrate 30' are patterned only from the side of the first surface 30a. The patterning may be conducted by any method without any particular limitation, and may be conducted by any of the known etching technologies, such as, wet etching, dry etching and the like, sand blast processing, physical processing using a cutting tool, or the like.

Preferably, wet etching by dipping process or by spraying process, may be employed. For example, when the conductive layer 20a is made of tin (Sn), ferric chloride solution can be used as the etching solution for the conductive layer 20a. Also, when the metal substrate 30' is made of 42 alloy, ferric chloride solution can be used as the etching solution for the metal substrate 30'.

Figure 8:
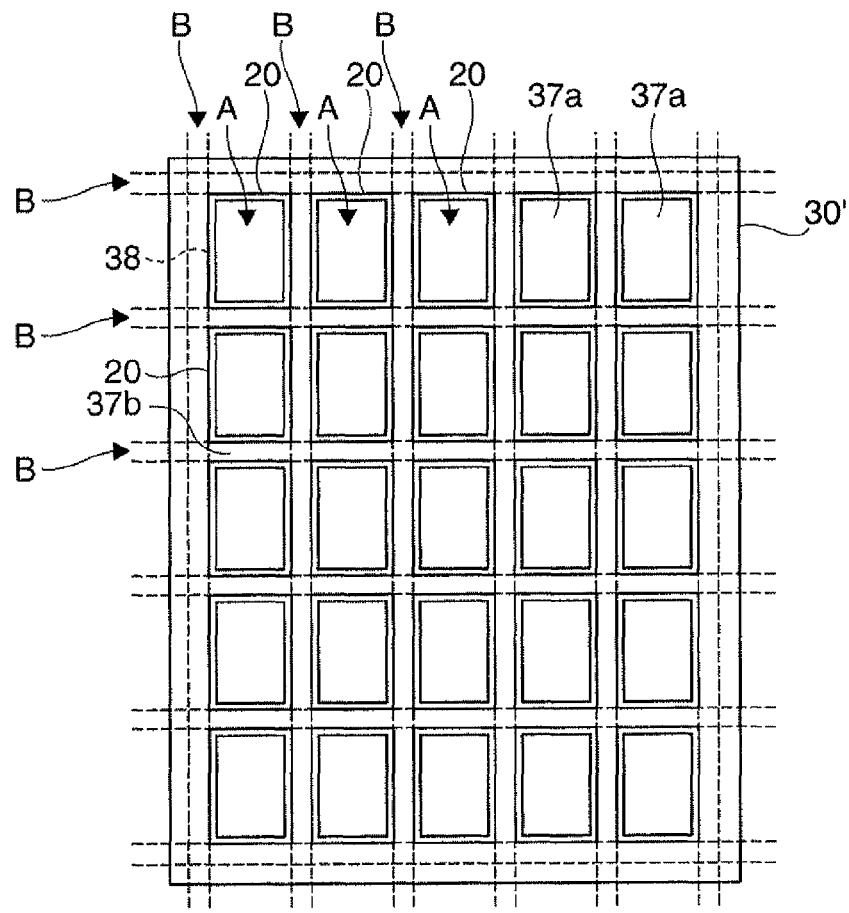
FIG. 8 is a schematic plan view for describing the method for manufacturing an oscillation device in accordance with the embodiment of the invention.

In the etching step for etching the metal substrate 30' (S14), the metal substrate 30' is half-etched so as to form a plurality of concave portions 37 (37a, 37b). The concave portions 37a are concave portions that are formed in the first regions A, and the concave portions 37b are concave portions formed along the second regions B that are dicing lines. By this step, as shown in FIG. 7C, a plurality of metal protrusions 38 can be formed. Also, the plural concave sections 37 (37a, 37b) can be formed into desired shapes by controlling the time duration of etching in a spraying type wet etching. By this process, as shown in FIG. 8, ring-shaped metal protrusions 38 having the adhesion layers 20 formed at their tip portions in the respective first regions A of the metal substrate 30' are formed. Although not shown, the resist patterns 50 (50a, 50b) may appropriately be removed after the step of etching the metal substrate and the conductive layer.

Singulation (S15)

Next, the metal substrate 30' that has been patterned is cut along the second regions B that are dicing lines, thereby separating the plural first regions A as individual segments from one another. By this step, lid members 30 equipped with the adhesion layers 20 can be formed at the same time and in plurality. Any cutting method is used without any particular limitation, and any of the known dicing methods may be used.

Figure 7E:
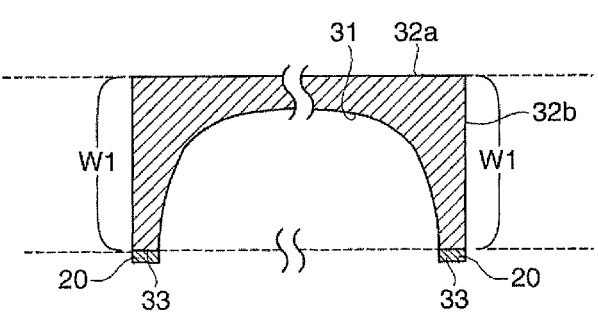

As shown in FIG. 7E, by the steps described above, the lid member 30 having an inner surface 31, an outer surface 32 (including an upper surface 32a and a side surface 32b) and a connection surface 33 can be formed.

According to the method for manufacturing the lid member 30 described above, the metal substrate 30' whose outer shape can be processed by a method with high processing precision, such as, chemical etching, is used, such that the lid member 30 having a desired outer shape can be prepared with high dimensional accuracy.

Also, by processing the metal substrate 30' whose thickness is substantially uniform, the width W1 between the upper surface 32a and the connection surface 33 can be readily made uniform at the circumferential section of the opening section 36 of the lid member 30, as shown in FIG. 7E. In other words, by using the metal substrate 30' whose thickness is substantially uniform, a high degree of flatness can be readily secured at the connection surface 33.

Also, a plurality of the lid members 30 are formed from a common metal substrate 30, such that qualitative dispersions in measurements of the lid members 30 can be reduced, and their shape quality can be improved. Accordingly, the possibility of occurrence of connection defects with respect to the base substrates 10, which may occur due to processing accuracy defects in the process of manufacturing the lid members 30, can be reduced.

Therefore, according to the method for manufacturing the lid member 30 with the metal substrate 30' described above, lid members 30 having high external shape quality can be commercially manufactured at high-throughput, and the connection reliability with the base substrates 10 can be improved.

First Modification Example

Referring to FIGS. 9A-9D and FIG. 10, a method for manufacturing a lid member 130 of the oscillation device 101 in accordance with the first modification example will be described.

The step of preparing the lid member 130 of the oscillation device 101 in accordance with the first modification example also includes the steps of preparing a metal substrate (S11), forming a conductive layer composed of the same material as that of an adhesion layer (S12), and etching the metal substrate and the conductive layer (S13, S14). In the step of preparing the lid member 130 described below, only steps different from the steps of preparing the lid member 30 will be described.

Formation of Resist Pattern (S13)

Figure 9A:
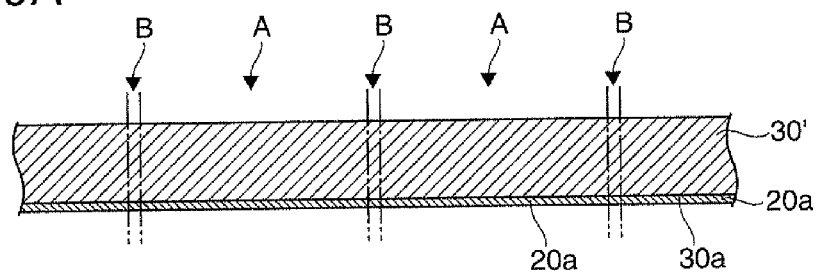
FIGS. 9A-9D are schematic cross-sectional views for describing the method for manufacturing an oscillation device in accordance with an embodiment of the invention.
Figure 9B:
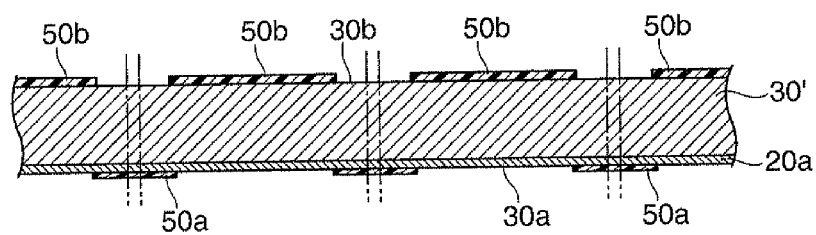

As shown in FIG. 9A and FIG. 9B, a resist pattern 50a and a resist pattern 50b are formed on a metal substrate 30' having a conductive layer 20a formed thereon, by known photolithography technology. In the steps of preparing the lid member 130, the resist pattern 50 and the resist pattern 50b having desired patterns are formed on both of the first surface 30a and the second surface 30b, respectively.

Etching of Metal Substrate and Conductive Layer (S14)

Figure 9C:
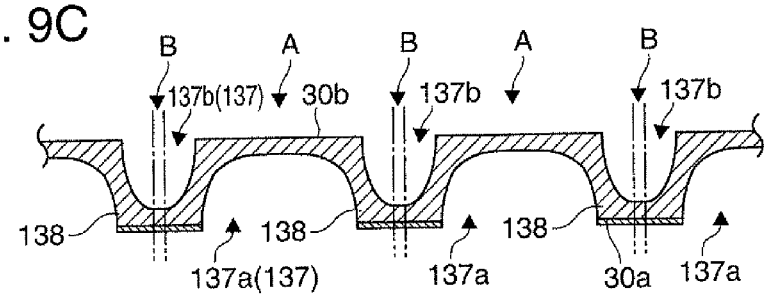
Figure 9D:
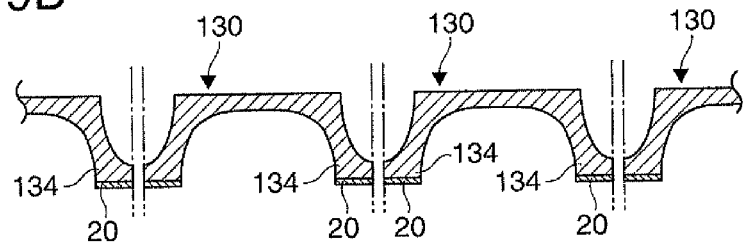

Next, as shown in FIG. 9C, the conductive layer 20a and the metal substrate 30' are etched from both surface sides, i.e., the first surface 30a and the second surface 30b. In the step of etching the conductive layer 20a and the metal substrate 30', the etching may preferably be conducted by dipping type or spraying type wet etching, like the steps of preparing the lid member 30.

Figure 10:
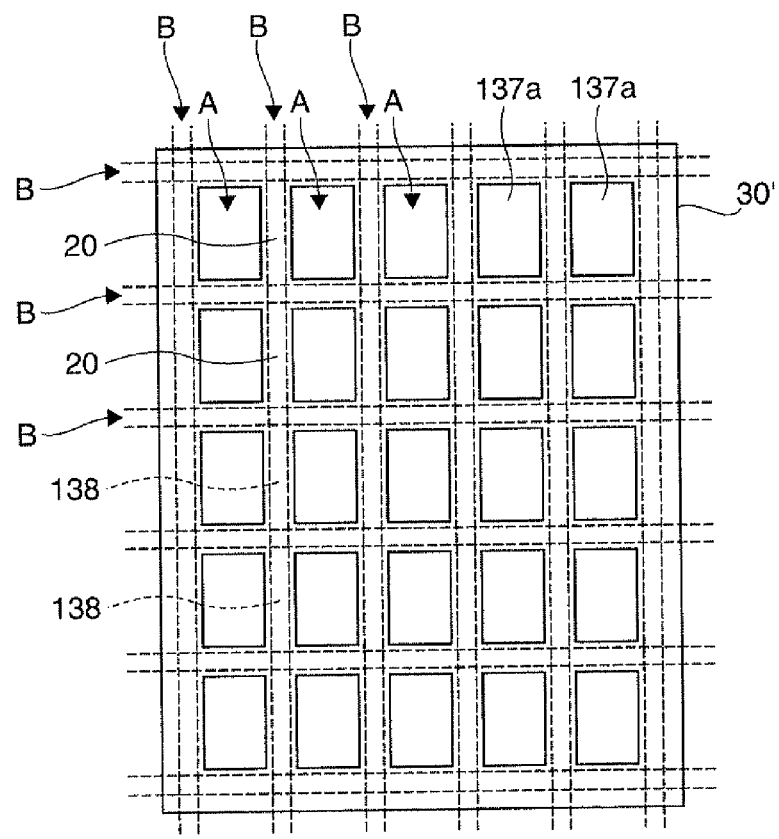
FIG. 10 is a schematic plan view for describing the method for manufacturing an oscillation device in accordance with the embodiment of the invention.

In the etching step for etching the metal substrate and the conductive layer (S14), the metal substrate 30' is half-etched so as to form a plurality of concave portions 137 (137a, 137b). The concave portions 137a are concave portions that are formed in the first regions A from the side of the first surface 30a, and the concave portions 137b are concave portions formed along the second regions B that are dicing lines from the side of the second surface 30b. By this step, as shown in FIG. 9C, a plurality of arch sections 138 can be formed. Accordingly, as shown in FIG. 9C and FIG. 10, in peripheral sections of the respective first regions A and in the second regions B of the metal substrate 30', the arch sections 138 having the adhesion layers 20 formed at their tips can be formed in a lattice configuration.

Singulation (S15)

Next, the metal substrate 30' that has been patterned is cut along the second regions B that are dicing lines, thereby separating the plural first regions A as individual segments from one another. In this singulation step, each of the arch sections 138 is cut along its center. By the steps described above, as shown in FIG. 9D, the lid members 130 having outwardly extending sections 134 can be formed.

2.2 Preparation of Base Substrate (S21-S29)

Next, referring to FIGS. 11-14, the steps of preparing a base substrate 10 (S21-S29) will be described.

Figure 11:
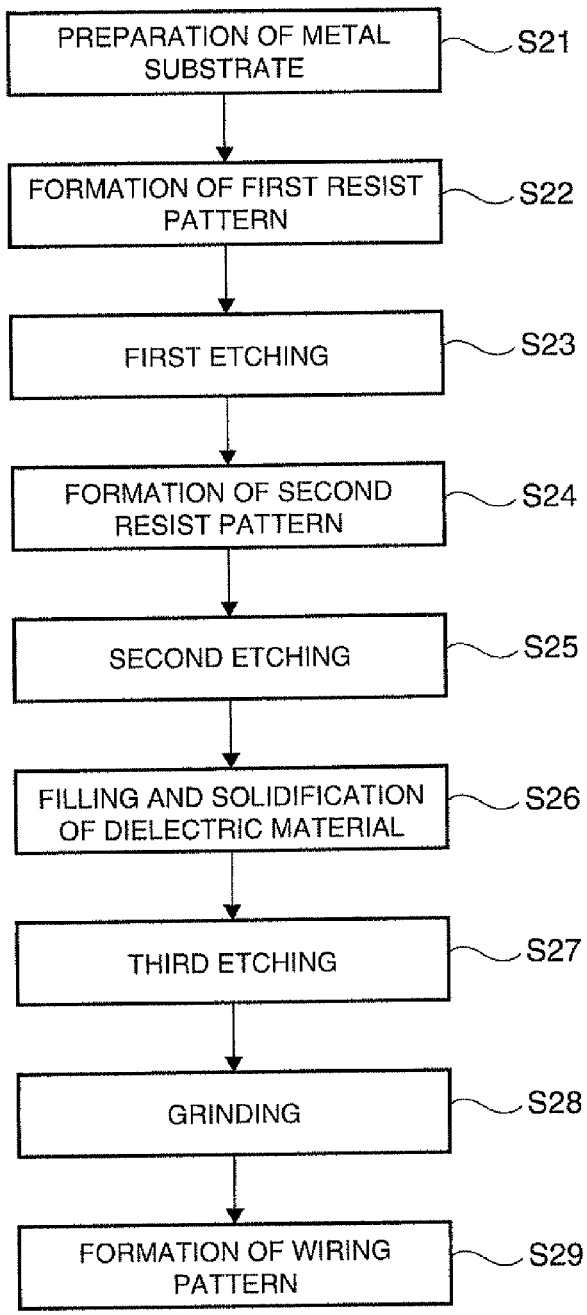
FIG. 11 is a flow chart for describing the steps of preparing a base substrate in the method for manufacturing an oscillation device in accordance with the embodiment of the invention.

As shown in FIG. 11, the steps of preparing the base substrate 10 include the step of preparing a metal substrate (S21), the steps of forming a plurality of metal protrusions by etching the metal substrate (S22-S25), the step of forming a dielectric layer in a manner to cover the plurality of metal protrusions (S26), forming a plurality of metal members made up of metal protrusions by etching the metal substrate so as to make the plurality of metal protrusions become independent from one another (S27), grinding the dielectric layer such that the plurality of metal members are exposed through the dielectric layer (S28), and the step of forming a wiring pattern connected to the metal member (S29).

Preparation of Metal Substrate (S21)

Figure 12A:
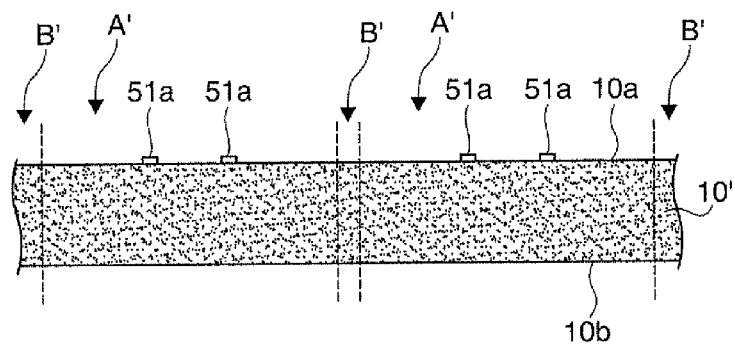
FIGS. 12A-12C are schematic cross-sectional views for describing the method for manufacturing an oscillation device in accordance with the embodiment of the invention.

First, a metal substrate 10' is prepared. The metal substrate 10' is a member that becomes to form metal members 14 (14a and 14b) of the base substrate 10, and is a substrate having a first surface 10a, and a second surface 10b on the opposite side of the first surface 10a, as shown in FIG. 12A. Here, the first surface 10a is a surface that will be located on the side of the second surface 13 of the base substrate 10, the second surface 10b is a surface that will be located on the side of the first surface 12 of the base substrate 10, and the material of the metal substrate 10' is selected from materials that form the metal members 14. Furthermore, the metal substrate 10' is a thickness greater than the design thickness of the base substrate 10.

The metal substrate 10' may be provided with a plurality of first regions A' and second regions B' respectively surrounding the first regions A'. Each of the first regions A' is a region that becomes to be the base substrate 10, and the second regions B' may be regions to be cut (dicing line) in the singulation step.

Next, the metal substrate 10' is etched from the side of the first surface 10a, thereby forming a plurality of metal protrusions 14'. An example of the step of forming a plurality of metal protrusions 14' (S22-S25) will be described below.

Formation of First Resist Pattern (S22)

First, as shown in FIG. 12A, a first resist pattern 51a is formed on the first surface 10a by known photoresist technology. The first resist patterns 51a correspond to regions where the metal protrusions 14' are formed within each of the first regions A', and are provided in an area where metal members 14a are to be formed. Therefore, within each of the first regions A', the first resist patterns 51a can be formed at areas corresponding to the number of the metal members 14a of the base substrate 10.

First Etching (S23)

In the first etching step (S23), the etching is conducted from the side of the first surface 10 of the metal substrate 10'. In this etching step, dipping type or spraying type wet etching can be employed. For example, when the metal substrate 10' is made of 42 alloy, ferric chloride solution can be used as the etching solution for the metal substrate 10'.

In the first etching step (S23), the metal substrate 10' is half-etched so as to form a plurality of concave portions 10c. The plurality of concave portions 10c may only need to have at least first depth D1 (the depth measured from the first surface 10a as reference), and may mutually have the same depth, or different depths.

Formation of Second Resist Pattern (S24)

Figure 12B:
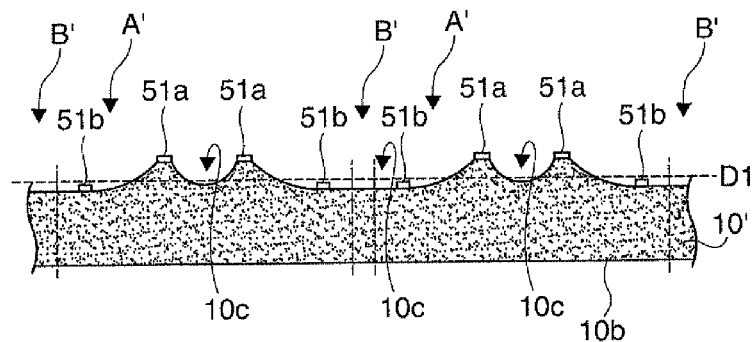

Next, as shown in FIG. 12B, second resist patterns 51b are formed by known photoresist technology on the half-etched surface on the side of the first surface 10a. The second resist patterns 51b correspond to regions where the metal protrusions 14' are formed within each of the first regions A', and are provided in areas where metal members 14b are to be formed.

Second Etching (S25)

Next, in the second etching step (S24), the etching is further conducted from the side of the first surface 10a of the metal substrate 10'. In this etching step, dipping type or spraying type wet etching can be employed.

In the second etching step (S25), the metal substrate 10' is further half-etched so as to form a plurality of concave portions 10d. The plurality of concave portions 10d may only need to have at least second depth D2 (the depth measured from the first surface 10a as reference, and D1<D2), and may mutually have the same depth, or different depths. Here, the second depth D2 is the same as the design thickness of the base substrate 10.

Figure 12C:
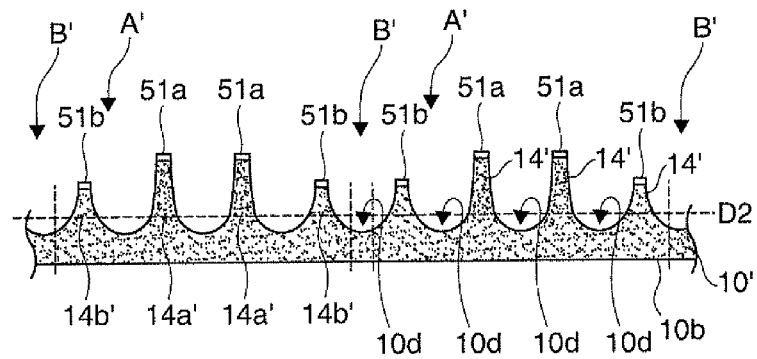
Figure 13:
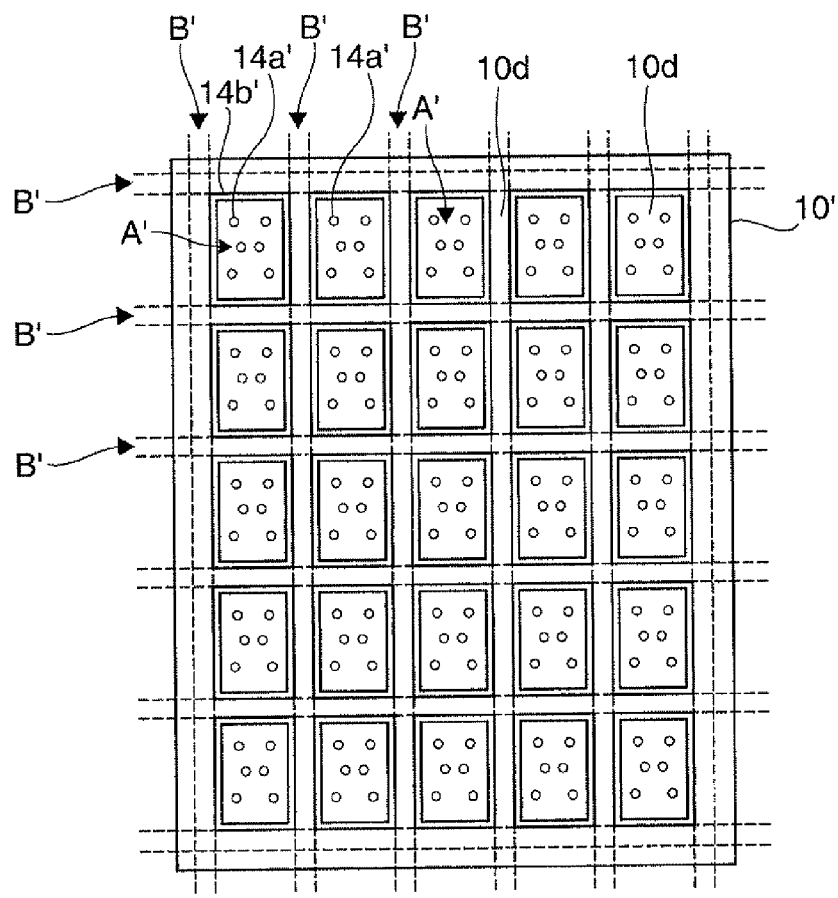
FIG. 13 is a schematic plan view for describing the method for manufacturing an oscillation device in accordance with the embodiment of the invention.

By the steps S22-S25 conducted so far, as shown in FIG. 12C and FIG. 13, the metal substrate 10' is etched from the side of the first surface 10a, and the plurality of metal protrusions 14' are formed. As shown in FIG. 12C and FIG. 13, a plurality of post-like (generally round columnar) metal protrusions 14a are formed in the central area of each of the first regions A', and a ring-shaped metal protrusion 14b' may be formed in a manner to surround the central area.

Although not shown, after the second etching step, the first resist pattern 51a and the second resist pattern 51b may be appropriately removed, or may be removed in the grinding step to be described below (S28).

Filling and Solidification of Dielectric Material (S23)

Figure 14A:
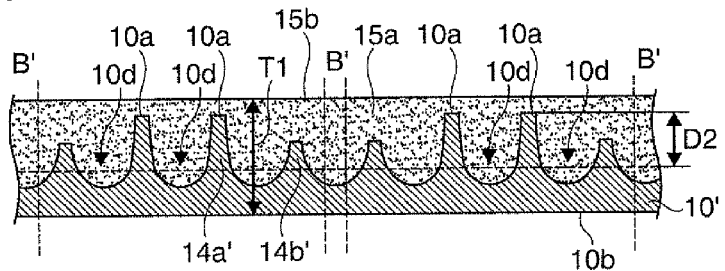
FIGS. 14A-14D are schematic cross-sectional views for describing the method for manufacturing an oscillation device in accordance with the embodiment of the invention.
Figure 14B:
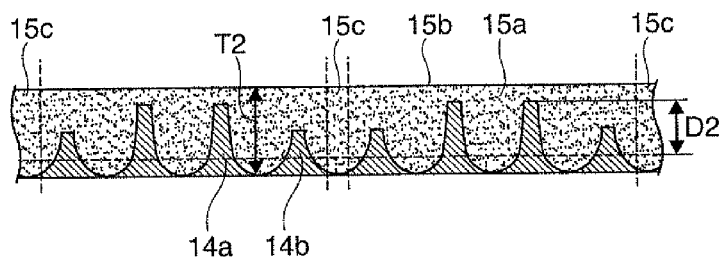

Next, as shown in FIG. 14A, dielectric material is filled and solidified in a manner to cover the plural metal protrusions 14' (14a', 14b'), thereby forming a dielectric layer 15a on the side of the first surface 10a. For example, dielectric material, such as, thermosetting type resin material having fluidity at room temperature is filled in the concave portions 10d, in a manner to cover the metal protrusions 14'. Thereafter, the filled dielectric material is sintered to form the dielectric layer 15a. Here, as shown in FIG. 14A, the upper surface of the dielectric layer 15a is defined as an upper surface 15b. Also, the dielectric layer in the second region B' is defined as a dielectric layer 15c.

When the maximum thickness of the dielectric layer 15a and the metal substrate 10' combined is T1 (the thickness between the upper surface 15b and the second surface 10b)

upon completing this step, the dielectric layer 15a is formed such that T1 is greater than the design thickness D2 of the base substrate 10.

Third Etching (S27)

Next, in the third etching step (S27), the metal substrate 10' is etched from the side of the second surface 10b in a manner that the plural metal protrusions 14' become independent from one another, thereby forming a plurality of metal members 14 (14a, 14b) composed of the metal protrusions 14'. Here, the state in which the plural metal protrusions 14' are independent from one another means that the metal protrusions 14' are separated from one another, and not electrically connected with one another. In this step, the dielectric layer 15b is exposed on the side of the second surface 10b.

The third etching is conducted such that, when the maximum thickness of the dielectric layer 15a and the metal substrate 10' combined is T2 upon completing this step, T2 becomes greater than the design thickness D2 of the base substrate 10.

In this etching step, known etching technology, such as, dipping type or spraying type wet etching or dry etching can be employed.

Grinding (S28)

Figure 14C:
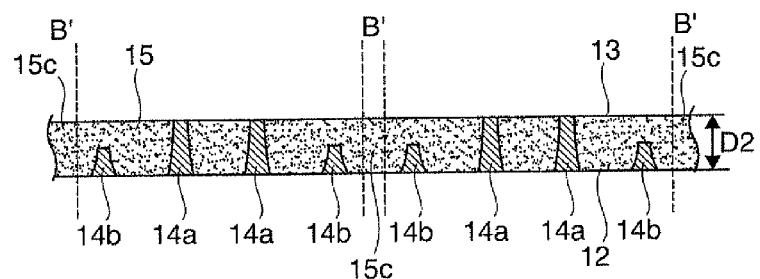

Next, as shown in FIG. 14C, the dielectric layer 15a is ground such that a plurality of the metal members 14 (14a) are exposed through the dielectric layer 15a. Any known grinding tool can be used for the grinding step. For example, the grinding step may be conducted with a high-speed rotating disk grinder.

As shown in FIG. 14C, the grinding step may be conducted on both sides of the first surface 10a and the second surface 10b. Also, after exposing the plural metal members 14a through the dielectric layer 15a, the metal members 14a and the dielectric layer 15a may further be ground. By this, the metal members 14a can be securely exposed.

In this step, the grinding is conducted such that the thickness of the layer to be ground substantially becomes to be the design thickness D2 of the base substrate 10. By this, as shown in FIG. 14C, the metal members 14 (14a, 14b) and the dielectric layer 15 having a desired thickness can be formed. Further, as the base substrate 10 having flat first surface 12 and second surface 13 (base substrates 10) can be manufactured, the reliability in connecting with the lid member 30 can be improved.

Formation of Wiring Pattern (S29)

Figure 14D:
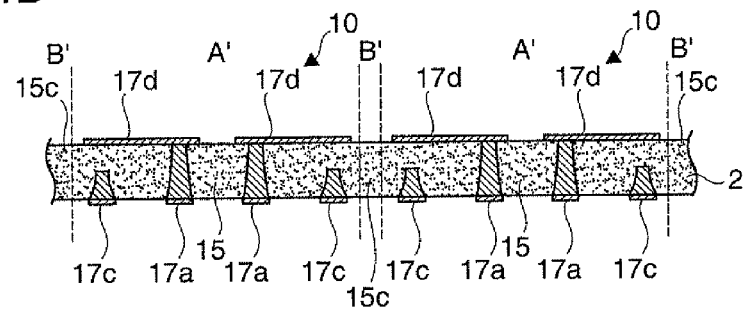

Next, as shown in FIG. 14D, wiring patterns 17 (17a, 17b, 17c, 17d) that are connected to the metal members 14 are formed on the first surface 12 and the second surface 13. For the step of forming the wiring patterns 17, a known film forming technology may be used. The wiring patterns 17 may be formed by, for example, screen printing, inkjet printing or the like. Alternatively, the wiring patterns 17 may be formed through forming a layer of metal composed of the same material as that of the wiring patterns 17 using a CVD method, a sputter method or the like, and then patterning the layer by a photolithography method.

As shown in FIG. 14D, through the steps described above, a plurality of base substrates 10 are formed respectively in the plurality of first regions A', and the dielectric layers 15c are formed in the second regions B' each surrounding the first region A'. The dielectric layer 15c in the second regions B', which are cutting regions, may be cut and removed whereby the base substrate 10 can be cut and separated into individual segments. Alternatively, without separating the base substrate 10 into individual segments, a plate-like member having a plurality of base substrates 10 connected with the dielectric layers 15c may be formed as a substrate 2

2.3 Manufacturing of Oscillation Device (S1-S7)

Next, referring to FIG. 5, FIGS. 15A-15C and FIGS. 16A-16C, the steps of manufacturing the oscillation device 100 (S1-S7) will be described.

Preparation of Base Substrate/Lid Member (S1)

As shown in FIG. 5, in the process of manufacturing the oscillation device 100 in accordance with an embodiment of the invention, the steps of preparing the base substrate 10 and the lid member 30 are conducted in a manner described above.

Figure 15A:
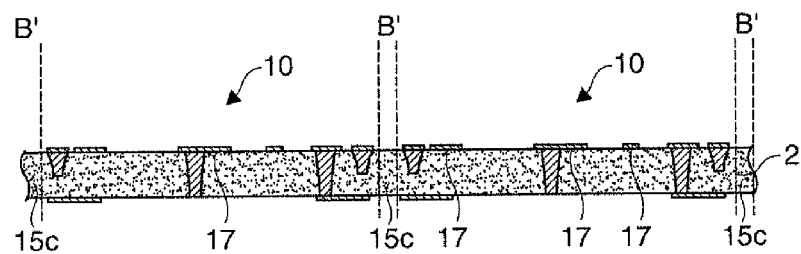
FIGS. 15A-15C are schematic cross-sectional views for describing the method for manufacturing an oscillation device in accordance with the embodiment of the invention.

In the steps of preparing the base substrate 10, as shown in FIG. 15A, a plate-like substrate 2 having a plurality of base substrates 10 connected with the dielectric layers 15c may be prepared. Alternatively, although not shown, the base substrates 10 separated from one another as individual segments may be prepared by cutting at the dielectric layers 15c. Preferably, in this step, the base substrates 10 may be prepared in the form of a substrate 2, whereby a plurality of base substrates 10 can be more readily handled, and thus the commercial productivity can be improved.

Mounting of Oscillation Member/IC Chip (S2)

Figure 15B:
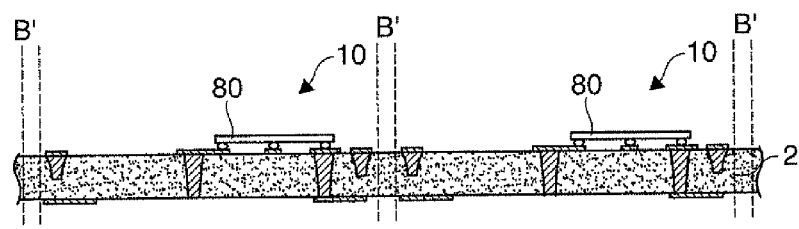
Figure 15C:
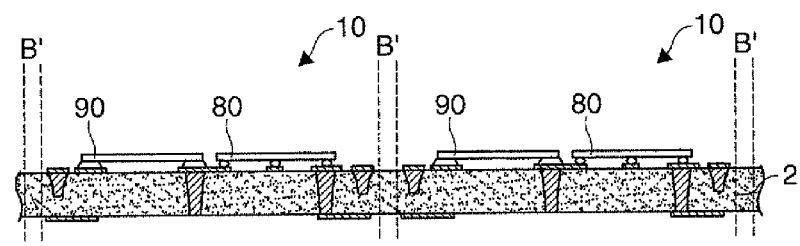

Next, as shown in FIG. 5, the oscillation member 70 and the IC chip 80 are mounted (electrically connected together and affixed in place). In this step, the order of mounting (die-attaching) the oscillation member 70 and the IC chip 80 is not particularly limited. For example, as shown in FIG. 15B and FIG. 15C, the IC chip 80 may be mounted on the wiring patterns 17 (17a, 17b), and thereafter the oscillation member 70 may be mounted on the wiring patterns 17a. By these steps, the oscillation member 70 and an integrated circuit of the IC chip 80 are electrically connected to each other. Also, the oscillation member 70 may be retained, for example, in a cantilever fashion.

Also, as shown in FIG. 15C, the oscillation members 70 and the IC chips 80 may be mounted on plural base substrates 10 of the substrate 2, respectively.

Frequency Adjustment (S3)

Next, as shown in FIG. 5, the frequency of the oscillation member 70 is adjusted. The oscillation adjustment is not limited to any particular method. For example, a portion of the electrode of the oscillation member 70 may be removed by laser trimming to reduce the mass of the oscillation member 70, or a mass may be added to the oscillation member 70 by vapor deposition or sputtering. Alternatively, data for the IC ship 80 may be rewritten for frequency adjustment.

Sealing (S4)

Figure 16A:
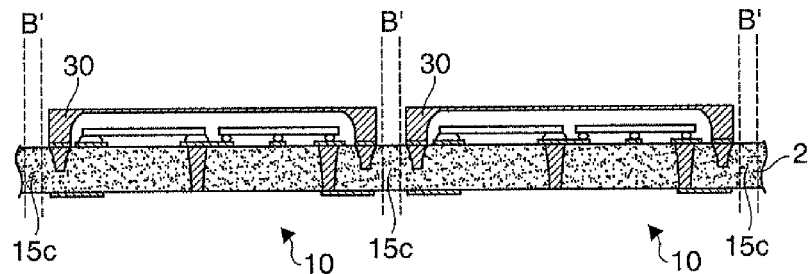
FIGS. 16A-16C are schematic cross-sectional views for describing the method for manufacturing an oscillation device in accordance with the embodiment of the invention.

Next, as shown in FIG. 16A, the lid member 30 is joined to the base substrate 10 in a manner to cover the oscillation member 70 and the IC chip 80, whereby the oscillation member 70 and the IC chip 80 are sealed in the space within the cavity 1. In this instance, the cavity 1 may be sealed while being degassed, or sealed while injecting inert gas such as nitrogen gas, argon gas or the like in the cavity 1, whereby the cavity 1 can be sealed while keeping the degree of vacuum within the cavity 1 at high level.

By keeping the degree of vacuum within the cavity 1 at high level, the crystal impedance (CI) of the oscillation member 70 can be maintained at constant level, and therefore the reliability in oscillation frequency of the oscillation device can be secured.

In this step, the base substrate 10 and the lid member 30 are joined together by an adhesive layer 20 provided at the lid member 30. The adhesion layer 20 is composed of metal having a first melting point, such that, by heating the adhesion layer 20 to the first melting point at which the adhesion layer 20 melts and exhibits its adhesion property, the base substrate 10 and the lid member 30 can be joined together.

Seal Plating (S5)

Figure 16B:
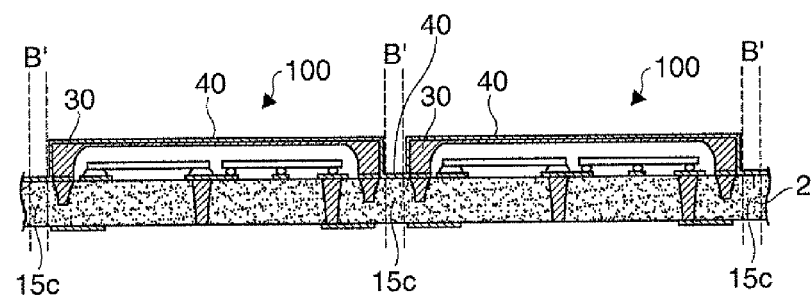

Next, as shown in FIG. 16B, seal plating treatment is applied to the surface of the substrate 2 of the plural lid members 30 joined together, thereby forming a metal layer 40. The metal layer 40 is formed in a manner to cover the plural lid members 30, the outer surface 22 of the adhesion layer 20, the first surface 12 (of the base substrate 10) in the first region A', and the dielectric layer 15c in the second region B' of the substrate 2. The metal layer 40 may preferably be formed by a plating method as in the seal plating treatment described above. As the plating method, electroless plating may preferably be used, but electroless plating can also be used. Also, the metal player 40 may be formed by any one of other known film forming technologies, without particular limitation to the plating method.

By integrally applying the seal plating treatment to the substrate 2 that seals the plural units, the plating quality can be made uniform. Therefore, a plurality of the oscillation devices 100 provided with the metal layer 40 having a uniform film thickness can be formed in the seal plating step that is conducted once.

Singulation (S6)

Figure 16C:
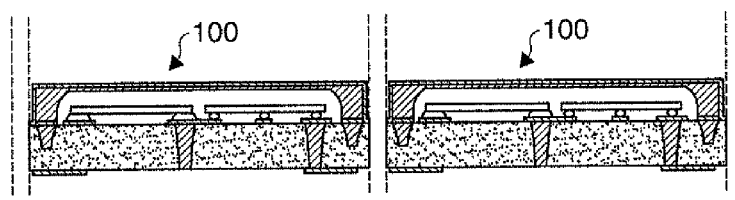

Next, as shown in FIG. 16C, by dicing along the second regions B', the oscillation devices 100 formed in plurality in the substrate 2 can be separated from one another.

By conducting the present step after the seal plating step (S5) has been applied to the substrate 2, the oscillation devices 100 each being securely covered by the metal layer 40 up to the outer peripheral portion 12a of the first surface 12 of the base substrate 10 can be manufactured (see FIG. 2).

Property Examination (S7)

The method for manufacturing the oscillation device 100, after having been separated as an individual device, may include the step of examining properties of the device, such as, electrical property and the like.

The steps described above can compose the method for manufacturing the oscillation device 100 in accordance with the embodiment of the invention.

The method for manufacturing the oscillation device 100 in accordance with the embodiment of the invention has, for example, the following characteristics.

The method for manufacturing the oscillation device 100 in accordance with the present embodiment includes the steps of joining the base substrate 10 and the lid member 30 through the adhesion layer 20 having the first melting point, and forming the metal layer 40 that covers the base substrate, the adhesion layer 20 and the lid member 30, using metal having the second melting point higher than the first melting point.

According to this method, in the sealing step (S4) of joining the base substrate 10 and the lid member 30 together, thereby containing the oscillation member 70 within the cavity 1, the base substrate 10 and the lid member 30 can be joined together, without using welding technology, by heating the adhesion layer 20 to the first melting point. Therefore, when designing the dimension and layout of the oscillation device 100, it is not necessary to consider limitations particular to a welding device, such as, the roller width of roller electrodes, the spot diameter of a laser beam and the like. This would contribute to the demand for downsizing and commercial production of oscillation devices 100.

Also, according to the method described above, the base substrate 10, the adhesion layer 20 and the lid member 30 are covered by the metal layer 40 composed of metal having the second melting point higher than the first melting point, such that it is possible to provide an oscillation device 100 that can maintain the joint between the base substrate 10 and the lid member 30 by the metal layer 40, even after the manufacturing process has been completed, for example, even when the adhesion layer 20 melts by the heat applied at the time of secondary mounting.

In view of the above, according to the method for manufacturing an oscillation device described above, it is possible to provide a method for manufacturing oscillation devices 100, which contributes to the demand for downsizing/miniaturization and commercial production, and generates highly reliable oscillation frequency.

First Modification Example

Next, methods for manufacturing the oscillation device 101 in accordance with the first modification example and the oscillation device 200 in accordance with the second modification example will be described with reference to the accompanying drawings.

In the method for manufacturing the oscillation device 101 in accordance with the first modification example, the oscillation device 101 may be manufactured through preparing the lid member 130 (see FIGS. 9A-9D and FIG. 10), in the steps of preparing the base substrate and the lid member (S1) in the method for manufacturing the oscillation device 100.

Second Modification Example

FIGS. 17A-17D schematically show an example of a method for manufacturing the oscillation device 200 in accordance with the second modification example. In the following description, the oscillation device 200 includes a base substrate 230 composed of ceramics.

Figure 17A:
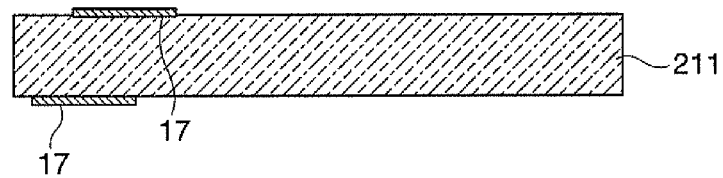
FIGS. 17A-17D are schematic cross-sectional views for describing a method for manufacturing an oscillation device in accordance with the second modification example of the embodiment of the invention.

First, as shown in FIG. 17A, a base substrate 211 in the state of a ceramic greensheet is prepared. Although not shown, a through hole or the like for degassing may be formed at a specified position in the base substrate 211. The through hole may be formed by, for example, mechanical cutting or etching with a mask.

Next, as shown in FIG. 17A, wiring patterns 17 are formed on both surfaces of the base substrate 211. This step may be conducted through, for example, coating conductive paste as an ink, using a printing method such as a screen print method, an inkjet method or the like, and sintering the conductive pate (metalizing). Also, the present step may be conducted through common film forming and patterning.

Figure 17B:

Next, as shown in FIG. 17B, a wall section 212 having an opening section 216 is laminated on the base substrate 211. The wall section 212 in the form of a ceramic greensheet may be used. The base substrate 211 and the wall section 212 are laminated, and then sintered, whereby an integrated ceramic base substrate 210 can be formed, as shown in FIG. 17C.

Figure 17C:
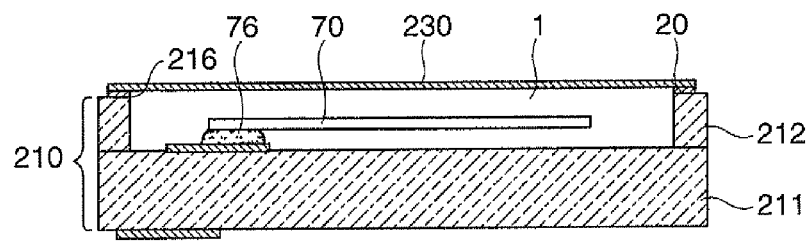

Next, as shown in FIG. 17C, an oscillation member 70 is inserted through the opening section 216 in the base substrate 210, and the oscillation member 70 is sealed by a lid member 230 while degassing the cavity 1. The lid member 230 and the base substrate 210 are joined by an adhesion layer 20.

Figure 17D:
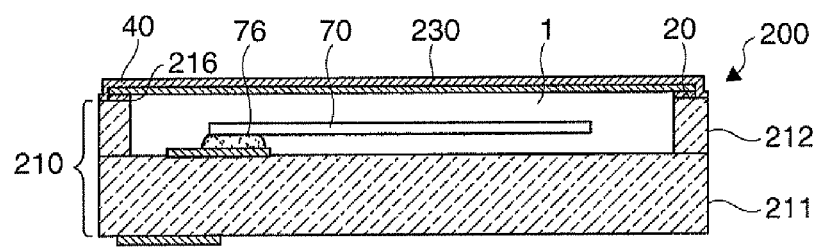

Next, as shown in FIG. 17D, the seal plating step is conducted to form a metal layer 40 that covers the base substrate 210 (the wall section 212), the adhesion layer 20 and the lid member 230.

By the steps described above, the oscillation device 200 in accordance with the second modification example can be manufactured.

3. Electronic Apparatus

Figure 18:
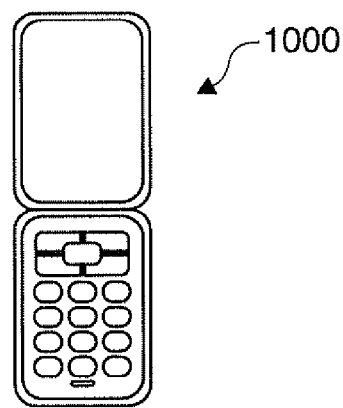
FIG. 18 schematically shows an example of an electronic apparatus.

Next, an electronic apparatus 1000 to which the oscillation device 100 (101, 200) in accordance with an embodiment of the invention is applied will be described. The electronic apparatuses 1000 to which the oscillation device 100 (101, 200) in accordance with the invention is applied may be, for example, portable telephones, electronic devices used on automobiles, digital cameras, projectors, portable telephone stations, digital TVs, digital video cameras, watches, portable digital music players, PDAs, personal computers, printers, and the like. For example, as shown in FIG. 18, when the electronic apparatus 1000 is a portable telephone, the oscillation device 100 in accordance with the invention can be used as a temperature compensation crystal oscillator for the wireless circuit, the GPS circuit or the like. Also, the oscillation device 100 (101, 200) in accordance with an embodiment of the invention can be used for motion sensing, such as, for a camera shake detection function. Further, the oscillation device 100 in accordance with an embodiment of the invention can be used as a voltage compensation type crystal oscillator for receiving one-segment broadcasting.

Although some embodiments of the invention have been described in detail above, those skilled in the art would readily appreciate that many modifications are possible in the embodiments without substantively departing from the novel matter and effects of the invention. Accordingly, such modifications are deemed to be included within the scope of the invention.

What is claimed is:

1. A method for manufacturing an oscillation device, the method comprising:
    preparing a base substrate and a lid member;
    mounting an oscillation member on the base substrate;
    containing the oscillation member within a cavity through joining the base substrate and the lid member together through an adhesion layer having a first melting point;
    degasing the cavity; and
    forming a metal layer that covers the base substrate, the adhesion layer and the lid member with metal having a second melting point higher than the first melting point, the adhesion layer and the lid member being encapsulated by the metal layer and the base substrate,
    wherein a portion of the cavity between the oscillating member and the lid in a thickness direction is an open space.

2. The method for manufacturing an oscillation device according to claim 1, wherein the first melting point is 350° C. or below.

3. The method for manufacturing an oscillation device according to claim 1, wherein the preparing of the lid member includes:
    preparing a first metal substrate having a first surface,
    forming a conductive layer composed of material identical with material of the adhesion layer on the first surface of the first metal substrate, and
    etching the first metal substrate and the conductive layer.

4. The method for manufacturing an oscillation device according to claim 3, wherein the preparing of the lid member includes forming a plurality of lid members from the first metal substrate.

5. The method for manufacturing an oscillation device according to claim 1, wherein the preparing of the base substrate includes:
    preparing a second metal substrate having a first surface and a second surface on the opposite side of the first surface,
    forming a plurality of metal protrusions by etching the second metal substrate from the side of the first surface,
    forming a dielectric layer on the side of the first surface to cover the plurality of metal protrusions,
    forming a plurality of metal members made up of the metal protrusions by etching the second metal substrate from the side of the second surface to make the plurality of metal protrusions become independent from one another,
    grinding the dielectric layer such that the plurality of metal members are exposed through the dielectric layer, and
    forming a wiring pattern that connects to the metal members.

6. The method for manufacturing an oscillation device according to claim 1, wherein, in the mounting of the oscillation member, a plurality of oscillation members are mounted on a substrate including a plurality of base substrates, respectively, and
    in the containing of the oscillation member within a cavity, the plurality of oscillation members are contained with a plurality of lid members, respectively, and
    further comprising cutting the substrate after the forming of the metal layer.

7. An oscillation device comprising:
    a base substrate provided with an oscillation member;
    a lid member that contains the oscillation member in a cavity;
    an adhesion layer that has a first melting point and connects the base substrate with the lid member; and
    a metal layer that has a second melting point higher than the first melting point and covers the base substrate, the adhesion layer and the lid member, the adhesion layer and the lid member being encapsulated by the metal layer and the base substrate,
    wherein a portion of the cavity between the oscillating member and the lid in a thickness direction is an open space.

8. An oscillation device according to claim 7, wherein the first melting point is 350° C. or below.

9. An oscillation device according to claim 7, wherein the base substrate includes a plurality of metal members, and a dielectric layer that retains the plurality of metal members.

10. An oscillation device according to claim 9, wherein the metal member and the lid member are composed of the same metal material.

* * * * *